United States Patent [19]

Yonehara

[11] Patent Number: 5,755,914
[45] Date of Patent: May 26, 1998

[54] METHOD FOR BONDING SEMICONDUCTOR SUBSTRATES

[75] Inventor: Takao Yonehara, Atsugi, Japan

[73] Assignee: Canon Kabushiki Kaisha, Tokyo, Japan

[21] Appl. No.: 675,844

[22] Filed: Jul. 5, 1996

Related U.S. Application Data

[63] Continuation of Ser. No. 478,655, Jun. 7, 1995, abandoned, which is a continuation of Ser. No. 110,972, Aug. 24, 1993, abandoned.

[30] Foreign Application Priority Data

Aug. 25, 1992 [JP] Japan ................................ 4-247173

[51] Int. Cl.[6] .............................. H01L 21/20; H01L 21/02
[52] U.S. Cl. ...................... 156/281; 148/DIG. 12; 148/DIG. 135; 156/153; 156/272.2; 437/921; 437/974
[58] Field of Search ....................... 156/153, 281, 156/272.2, 273.9; 437/225, 21, 921, 974; 148/DIG. 135, DIG. 12

[56] References Cited

U.S. PATENT DOCUMENTS

| | | | |
|---|---|---|---|
| 4,671,846 | 6/1987 | Shimbo et al. | 156/153 X |
| 4,774,196 | 9/1988 | Blanchard | 148/DIG. 135 |
| 4,939,101 | 7/1990 | Black et al. | 437/225 X |
| 4,983,251 | 1/1991 | Haisma | 437/225 X |
| 5,240,883 | 8/1993 | Abe et al. | 148/DIG. 135 X |
| 5,250,460 | 10/1993 | Yunagata et al. | |
| 5,383,993 | 1/1995 | Katada et al. | 156/153 |
| 5,407,506 | 4/1995 | Goetz et al. | 156/153 |
| 5,427,638 | 6/1995 | Goetz et al. | 156/153 |

FOREIGN PATENT DOCUMENTS

| | | | |
|---|---|---|---|
| 63-54740 | 3/1988 | Japan | 148/DIG. 12 |
| 1230255 | 9/1989 | Japan | 148/DIG. 12 |
| 1302837 | 12/1989 | Japan | 148/DIG. 12 |
| 3132055 | 6/1991 | Japan | 148/DIG. 12 |
| 5166690 | 7/1993 | Japan | |

OTHER PUBLICATIONS

Extended Abstract of Fall Meeting of Electrochemical Society, Phoenix, Arizona, Oct. 13–17, 1991, pp. 674–749.

Fripp, A.L., et al, "Structure of Silicon Films Deposited on Oxidized Silicon Wafers", J. Electrochem. Soc.: Solid State Science, vol. 117, No. 12 (Dec. 1970), pp. 1569–1571.

*Primary Examiner*—Jeff H. Aftergut
*Attorney, Agent, or Firm*—Fitzpatrick, Cella, Harper & Scinto

[57] ABSTRACT

A semiconductor substrate comprises a plurality of substrates to be bonded, wherein a bond promotion layer into which silicon atoms are implanted is provided in an interface between the substrates to be bonded, and the substrates are bonded to each other with the interposition of the bond promotion layer.

20 Claims, 1 Drawing Sheet

METHOD FOR BONDING SEMICONDUCTOR SUBSTRATES

This application is a continuation of application Ser. No. 478,655 filed Jun. 7, 1995, now abandoned, which is a continuation of application No. Ser. 08/110,972 filed Aug. 24, 1993, now abandoned.

BACKGROUND OF THE INVENTION

1. Field of the Invention

The present invention relates to a semiconductor substrate obtained by bonding and a method for preparing the same. More specifically, it relates to a semiconductor substrate which can be applied to a micro-machine technique, a derivative separation technique, an SOI technique, sensors, high-power elements, a high-frequency strip integrated circuit technique for communication, and the like.

2. Related Background Art

In recent years, it has been actively researched and developed to apply, to a micro-machine mechanism, a sensor, an SOI (silicon on insulator) and the like, a technique called "wafer direct bonding" or "Van der Waals bonding" in which two substrates are bonded to each other without interposing any adhesive.

These activities are noted in detail in the literature as, for example, "The first international symposium on semiconductor wafer bonding science, technology, and applications, Extended Abstract of Fall meeting of Electrochemical Society, Phoenix, Arizona, Oct. 13–17, 1991, pp 674–749".

Heretofore, an important problem in this technical field was is to inhibit the generation of voids (pores generated in a bonded interface) by a suitable means.

With regard to the generation of the voids, various causes have been considered. The main cause can be presumed to be that oxygen atoms and hydroxyl groups which cover the surfaces of substrates to be bonded are dehydrated and condensed to become water vapor, and the water vapor collects and forms the voids. The thus generated voids can be reduced by a further high-temperature heat treatment to diffuse the water vapor.

However, it is very difficult to decrease the voids which are caused by dust stuck on the surfaces of the substrates, roughness of wounds on the surfaces, contaminants on the surfaces, captured gases, or the warpage of the substrates.

In the case that a silicon substrate is bonded to an insulating substrate which is made of a material such as glass other than silicon and which functions as a supporting member, after the two substrates have been bonded to each other, a heat treatment is carried out at about 1,000° C. in order to strengthen the bonding between these substrates. At this time, however, there occur problems such as the warpage of the bonded substrates, the cracks of the substrates and the separation of both the substrates from each other owing to different thermal expansion coefficients of both the substrates.

Another example is one present in which a substrate synthesized from a material having a thermal expansion coefficient close to that of silicon is used as the supporting substrate, but as known, such a material is poor in heat resistance and cannot withstand a heat treatment for the reinforcement of the bonding and a process temperature for the formation of devices.

SUMMARY OF THE INVENTION

An object of the present invention is to provide a semiconductor substrate in which the generation of fine voids attributed to roughness on the surfaces of substrates to be bonded is inhibited, and a method for preparing this kind of semiconductor substrate.

Another object of the present invention is to provide a method for preparing a semiconductor substrate in which the bonding force of a bonding interface is increased so much as to overcome stress caused by thermal expansion, in the case that a silicon single crystal film is formed on a substrate having a thermal expansion coefficient different from that of silicon.

DETAILED DESCRIPTION OF THE PREFERRED EMBODIMENTS

Figure 1A:
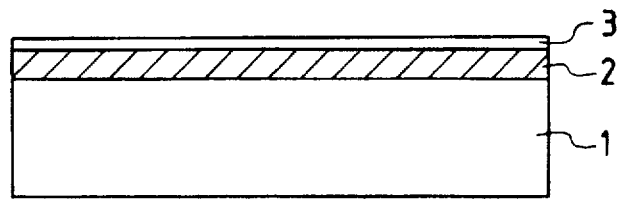
FIGS. 1A and 1B are schematic sectional views for explaining one example of the method of the present invention.

The first aspect of the present invention is directed to a semiconductor substrate comprising a plurality of substrates to be bonded, wherein a bond promotion layer into which silicon atoms are implanted is provided in an interface between the substrates to be bonded, and the substrates are bonded to each other with the interposition of the bond promotion layer.

The second aspect of the present invention is directed to a method for preparing a semiconductor substrate by bonding a plurality of substrates, said method being characterized by comprising:

a step of forming an insulating layer on the surface of a first substrate as a substrate to be bonded, a step of implanting silicon atoms into the surface of the insulating layer to form a bond promotion layer thereon, a step of bonding a second substrate to be bonded to the bond promotion layer on the first substrate, and a step of heating the bonded substrates to unify them.

According to the method for preparing the semiconductor substrate of the present invention, the silicon atoms are implanted into the interface between the bonded substrates, so that bonding force properties to a certain temperature of the interface are changed and increased. Consequently, it is possible to prevent the formation of unbonded regions in the bonding interface and the generation of voids owing to the unbonded regions which are the most important problems in a wafer bonding technique.

As a result of intensive investigation by the present inventor, it has been found that when insulating materials typified by silicon oxides are bonded to each other, silicon atoms in the uppermost surfaces of the insulating materials are terminated with oxygen atoms and so they are extremely stable and less reactive, and the bonding force between the insulating materials is weaker than when highly reactive silicon substrates are bonded to each other.

Thus, the present invention employs a method in which the silicon atoms capable of changing the surface physical properties of the insulating layer are slightly implanted as accelerated charged particles under a good control only into the uppermost portion of a thermally oxidized film maintaining flatness at an atomic level. By the employment of this method, silicon is implanted into the uppermost surface of the above-mentioned stable oxidized layer in which the silicon atoms are terminated with oxygen atoms and unbonded atoms are not present, to cut the bonding atoms which are terminated with the oxygen atoms. Consequently, unbonded atoms are formed to activate the surface of the insulating layer. As a result, the bonding force of the bonding interface can be increased.

As described above, according to the present invention, a bond promotion layer having an extremely excellent flatness and a large bonding force can be formed, whereby a semiconductor substrate which is free from voids in a bonding interface can be prepared.

Now, the present invention will be described in reference to FIGS. 1A and 1B and FIG. 2 in accordance with examples.

EMBODIMENT 1

Figure 1B:
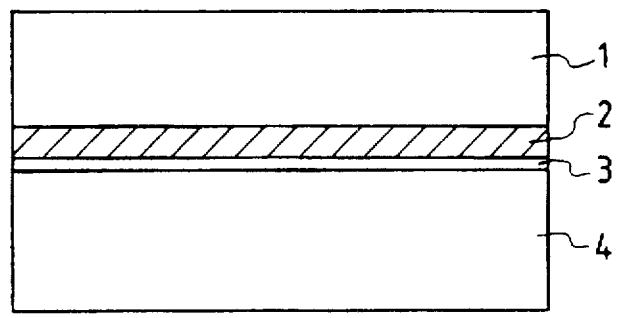

FIGS. 1A and 1B are schematic sectional views illustrating Embodiment 1 of the present invention. In the drawings, a first substrate 1 and a second substrate 4 are composed of a single element semiconductor such as silicon or germanium, a compound semiconductor such as gallium arsenide or indium phosphorus, or a transparent insulating material, for example, glass such as quartz.

Initially, a flat insulating layer 2 is formed on the surface of the first substrate 1. A thermally oxidized film is optimum for silicon. When the flatness of the thermally oxidized film is quantitatively measured by an interatomic force microscope, it is apparent that an extremely flat surface having a roughness of about several nanometers is formed.

In the case that a stable thermally oxidized layer is not obtained on the surface as in the case of the compound semiconductor, it is formed by a chemical vapor deposition, particularly a vacuum deposition, or a sputtering process.

Next, impurities which change surface physical properties of the oxide and which promote a bonding force are added to the uppermost surface (about 100 nm or less) of the insulating layer 2. In the case that the insulating layer 2 is silicon oxide, silicone is desirable. Furthermore, as the technique of the addition, there is used an implanting method of accelerated charged particles, that is, an ion implanting method or a thermal decomposition, adsorption from a gaseous phase and deposition. Thus, a bond promotion layer 3 is formed on the surface of the insulating layer 2 without impairing its flatness (FIG. 1A).

Next, as another substrate, a second substrate 4 is prepared, and both substrates are carefully washed, dried, bonded to each other with the interposition of the above-mentioned bond promotion layer, and then heated to strongly bond to each other (FIG. 1B).

According to the preparation method of this embodiment, the flatness of the bonded surfaces is originally good, but by providing the bond promotion layer of the present invention, such extremely fine voids as are caused by steps comparable to an atomic surface can be eliminated.

EMBODIMENT 2

Figure 2:
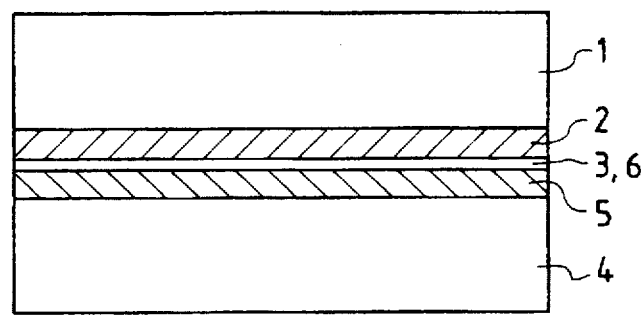
FIG. 2 is a schematic sectional view for explaining another example of the method of the present invention.

FIG. 2 is a schematic sectional view illustrating another embodiment of the present invention.

In this embodiment, a second substrate 4 is also provided with a bond promotion layer 6, as in the bond promotion layer 3 on the first substrate 1 described in Embodiment 1, and both the substrates are then bonded to each other. In this connection, reference numerals 2 and 5 are insulating layers of the respective substrates.

By this constitution, an effect of eliminating voids attributed to the further large surface roughness can be obtained.

Next, typical examples of the present invention will be described in more detail.

EXAMPLE 1

Initially, a 5-inch P-type (100) single-crystal silicon substrate (0.1–0.2 Ωcm) was prepared, and a thermally oxidized film having a thickness of 0.5 μm was formed on the surface of the substrate.

Next, silicon was added to the surface of the thermally oxidized film as thick as 0.1 μm at $1\times10^{18}$ atom·$cm^{-3}$ by ion implantation.

This substrate was washed with a mixed solution of hydrochloric acid, aqueous hydrogen peroxide and water, dried, and then bonded to a 5-inch single-crystal silicon substrate washed in the same manner at room temperature.

The thus bonded substrates were thermally treated at 1,000° C. for 20 minutes in nitrogen to further strengthen the bonding.

The thus bonded substrates of this example were observed by X-ray topography, and as a result, any voids were not observed. According to a tensile strength test, a bonding strength of 1,000 kgf/$cm^2$ or more was confirmed.

The first substrate was thinned to a thickness of 1 μm by grinding and polishing, and the detection of fine voids (10 μm or less) was attempted by an optical microscope, but no voids could be detected.

EXAMPLE 2

In the first place, a p-type (100) silicon single-crystal substrate having a resistivity of 0.01 Ω·cm was prepared, and an epitaxial layer having a thickness of 1.5 μm was formed.

The surface was oxidized as thick as 0.5 μm in the same manner as in Example 1, and silicon was ion-implanted at $1\times10^{17}$ atom·$cm^{-3}$ into the thermally oxidized layer as thick as 0.1 μm from the surface of the layer.

As a second substrate, there was prepared a silicon substrate which was thermally oxidized as thick as 1 μm and into which silicon was implanted on the surface thereof at $1\times10^{18}$ atom·$cm^{-3}$, and both the substrates were then washed with a mixed solution of hydrochloric acid, aqueous hydrogen peroxide and water, dried, and then bonded to each other at room temperature.

The bonded substrates were further subjected to a heat treatment at 1,100° C. for 60 minutes in nitrogen.

The thus bonded substrates were observed by X-ray topography, and as a result, any voids were not observed. According to a tensile strength test, a bonding strength of 1,200 kgf/$cm^2$ or more was confirmed.

EXAMPLE 3

Intially, a P-type (100) silicon single-crystal substrate having a resistivity of 0.01 Ω·cm was anodized on the surface thereof to form a porous layer, and an epitaxial layer having a thickness of 1.5 μm was formed.

Next, the surface was oxidized as thick as 0.1 μm, and a silicon oxide layer having a thickness of 0.5 μm was then deposited by a chemical vapor deposition.

Furthermore, silicon was ion-implanted into the oxidized layer as thick as 0.1 μm from the surface of the layer at $2\times10^{17}$ atom·$cm^{-3}$.

As a second substrate, there was prepared a fused quartz substrate into which silicon was implanted as thick as 0.1 μm from its surface at $1\times10^{18}$ atom·$cm^{-3}$, and both the substrates were then washed with a mixed solution of hydrochloric acid, aqueous hydrogen peroxide and water, dried, and then bonded to each other at room temperature.

The bonded substrates were further subjected to a heat treatment at 400° C. for 6 hours in nitrogen.

The bonded substrates were ground from the side of the silicon substrate by polishing and selective chemical etching for the porous portion to obtain a single-crystal silicon thin layer on the quartz glass.

The substrates of this example were observed by an optical microscope and X-ray topography, and as a result, any voids were not observed. According to a tensile strength test, a bonding strength of 500 kgf/cm$^2$ or more was confirmed.

EXAMPLE 4

A 5-inch p-type (100) single-crystal silicon substrate (0.1–0.2 Ωcm) was prepared, and a thermally oxidized film having a thickness of 0.5 μm was formed on the surface of the substrate.

Next, silicon was heated, melted and then evaporated on the surface of the thermally oxidized film by electron beam impact to add silicon atoms to the surface of the thermally oxidized film at $1 \times 10^{13}$ cm$^{-2}$.

This substrate was then washed with a mixed solution of hydrochloric acid, aqueous hydrogen peroxide and water, dried, and then bonded, at room temperature, to a 5-inch single-crystal silicon substrate washed in the same manner.

The bonded substrates were subjected to a heat treatment at 1,000° C. for 20 minutes in nitrogen.

The bonded substrates were observed by X-ray topography, and as a result, any voids were not observed. According to a tensile strength test, a bonding strength of 1,000 kgf/cm$^2$ or more was confirmed.

The first substrate was thinned to a thickness of 1 μm by grinding and polishing, and the detection of fine voids (10 μm or less) was attempted by an optical microscope, but no voids could be detected.

EXAMPLE 5

A p-type (100) silicon single-crystal substrate having a resistivity of 0.01 Ω-cm was prepared, and an epitaxial layer having a thickness of 1.5 μm was then formed.

The surface was oxidized as thick as 0.5 μm in the same manner as in Example 1, and silicon was added to the surface of the thermally oxidized layer at $1 \times 10^{14}$ atom·cm$^{-2}$ by a sputtering process using argon which was usually utilized in an integrated circuit manufacturing technique.

As a second substrate, there was prepared a silicon substrate which was thermally oxidized as thick as 1 μm and into which silicon was implanted on the surface thereof at $1 \times 10^{18}$ atom·cm$^{-3}$, and both the substrates were then washed with a mixed solution of hydrochloric acid, aqueous hydrogen peroxide and water, dried, and then bonded to each other at room temperature.

The thus bonded substrates were subjected to a heat treatment at 1,100° C. for 60 minutes in nitrogen.

The bonded substrates were observed by X-ray topography, and as a result, any voids were not observed. According to a tensile strength test, a bonding strength of 1,200 kgf/cm$^2$ or more was confirmed.

As described above, according to the present invention, in a semiconductor substrate obtained by a bonding method, an impurity such as silicon is introduced into an insulating layer surface of a bonded interface, whereby bonding force characteristics to a certain temperature in the interface can be changed and increased. Therefore, a bond promotion layer having an excellent flatness and a large bonding force can be formed.

In consequence, it is possible to prevent the formation of unbonded regions in the bonding interface and the generation of voids owing to the unbonded regions which are the most important problems in a wafer bonding technique.

Thus, according to the present invention, the generation of the fine voids attributed to roughness on the surfaces of the substrates to be bonded can be effectively inhibited, and also in the case that the substrates having different thermal expansion coefficients are bonded under the control of stress caused by thermal expansion, they can be strongly bonded.

What is claimed is:

1. A method for preparing a semiconductor substrate by bonding a plurality of substrates, free of voids, said method comprising:

a step of forming a flat insulating layer comprising silicon oxide at an atomic level on the surface of a first substrate as a substrate to be bonded, a step of implanting silicon atoms into the uppermost surface of the insulating layer, while still maintaining a flat layer at an atomic level, to form a bond promotion layer thereon, a step of bonding a second substrate to be bonded to the bond promotion layer on the first substrate, at room temperature, and a step of heating the bonded substrates at a temperature in the range of 400° to 1,100° C., which is below the melting point of silicon, to further strengthen the bonding, thereby obtaining a semiconductor substrate free of voids.

2. The method for preparing a semiconductor substrate according to claim 1, wherein said method further comprises;

a step of forming a flat insulating layer comprising silicon oxide at atomic level, on the surface of the second substrate, a step of implanting an impurity for increasing a bonding force into the uppermost surface of the insulating layer on the surface of the second substrate, while still maintaining a flat layer at an atomic level, to form a bond promotion layer thereon, and a step of bonding the bond promotion layer on the second substrate to the bond promotion layer on the first substrate at room temperature, and a step of heating the bonded substrates at a temperature range of 400° to 1100° C. to further strengthen the bonding, thereby obtaining a semiconductor substrate free of voids.

3. The method for preparing a semiconductor substrate according to claim 1, wherein the silicon atoms are implanted by accelerated charged particles.

4. The method for preparing a semiconductor substrate according to claim 1, wherein the silicon atoms are implanted via a gaseous phase.

5. The method for preparing a semiconductor substrate according to claim 1, wherein the substrates are composed of a single element, a compound semiconductor or a glass.

6. A method for preparing a semiconductor substrate comprising the steps of:

providing a first substrate having at least a surface comprising silicon oxide, the surface being flat at an atomic level;

bonding a second substrate to the surface comprising silicon oxide implanted with the silicon atoms, at heating the bonded substrates at a temperature in the range of 400° to 1100° C.

7. The method according to claim 6, wherein the first substrate is provided by forming an insulating layer comprising silicon oxide on a surface of a silicon substrate.

8. The method according to claim 7, wherein the second substrate comprises silicon.

9. The method according to claim 6, wherein the first substrate is provided by forming an epitaxial layer on a silicon substrate and by forming an insulating layer comprising silicon oxide on the epitaxial layer.

10. The method according to claim 9, wherein the second substrate comprises a silicon substrate having an insulating layer comprising silicon oxide on a surface thereof, and wherein a surface of the insulating layer o the second substrate is bonded to the first substrate.

11. The method according to claim 10, further comprising, before the bonding step, the step of implanting silicon atoms into the surface of the insulating layer of the second substrate.

12. The method according to claim 6, wherein the first substrate comprises quartz.

13. The method according to claim 6, wherein the first substrate is provided by forming an epitaxial layer on a porous layer of a surface a silicon substrate, and by forming an insulating layer comprising silicon oxide on the epitaxial layer.

14. The method according to claim 13, wherein the second substrate comprises quarts.

15. The method according to claim 14, further comprising before the bonding step, the step of implanting silicon atoms into a surface of the second substrate comprising quartz.

16. The method according to any one of claims 13 to 16, further comprising, after the heating step, the step of removing the porous layer.

17. The method according to claim 16, wherein the porous layer is removed by chemical etching.

18. The method according to claim 6, wherein the heating step is carried out in a nitrogen atmosphere.

19. The method according to claim 6, wherein the implantation of silicon atoms is carried out by accelerating silicon ions and impinging the ions into the surface comprising silicon oxide.

20. The method according to claim 6, wherein the implantation of the silicon atoms is carried out in a gas phase.

\* \* \* \* \*

UNITED STATES PATENT AND TRADEMARK OFFICE
CERTIFICATE OF CORRECTION

PATENT NO. : 5,755,914

DATED : May 26, 1998

INVENTOR(S) : TAKAO YONEHARA

It is certified that error appears in the above-identified patent and that said Letters Patent is hereby corrected as shown below:

Title page,
AT [56] REFERENCES CITED

U.S. PATENT DOCUMENTS

"Yunagata et al." should read --Yamagata et al.--.

AT [56] REFERENCES CITED

FOREIGN PATENT DOCUMENTS

```
"1230255   9/1989   Japan
 1302837  12/1989   Japan
 3132055   6/1991   Japan
 5166690   7/1993   Japan" should read
--1-230255   9/1989   Japan
  1-302837  12/1989   Japan
  3-132055   6/1991   Japan
  5-166690   7/1993   Japan--.
```

AT [56] REFERENCES CITED

OTHER PUBLICATIONS

"Extended Abstract" should read
--Extended Abstracts--.

COLUMN 1

Line 28, "Abstract" should read --Abstracts--.

COLUMN 4

Line 5, "P-type" should read --p-type--; and
Line 54, "P-type" should read --p-type--.

UNITED STATES PATENT AND TRADEMARK OFFICE
CERTIFICATE OF CORRECTION

PATENT NO. : 5,755,914
DATED : May 26, 1998
INVENTOR(S) : TAKAO YONEHARA

It is certified that error appears in the above-identified patent and that said Letters Patent is hereby corrected as shown below:

COLUMN 6

Line 66, "oxide,the" should read --oxide, the--.

COLUMN 7

Line 2, "at" should read --at room temperature; and--; and
   Line 17, "o" should read --of--.

COLUMN 8

Line 3, "surface" should read --surface of--;
   Line 7, "quarts." should read --quartz.--;
   Line 8, "comprising" should read --comprising,--; and
   Line 11, "16," should read --15,--.

Signed and Sealed this

Ninth Day of February, 1999

Attest:

*Attesting Officer*

*Acting Commissioner of Patents and Trademarks*